United States Patent [19]

Tsujii et al.

[11] Patent Number: 4,571,669
[45] Date of Patent: Feb. 18, 1986

[54] TRANSFORMER WITH RECTIFIER

[75] Inventors: Gen Tsujii; Takashi Yanagisawa, both of Saitama, Japan

[73] Assignee: Honda Giken Kogyo Kabushiki Kaisha, Tokyo, Japan

[21] Appl. No.: 590,383

[22] Filed: Mar. 16, 1984

[30] Foreign Application Priority Data

Sep. 13, 1983 [JP] Japan .................. 58-140867[U]

[51] Int. Cl.$^4$ ............................................. H02M 1/00
[52] U.S. Cl. ..................................... 363/144; 357/77; 219/137 PS
[58] Field of Search ................. 363/144, 145; 357/76, 357/77; 219/130.1, 137 PS

[56] References Cited

U.S. PATENT DOCUMENTS 3,771,025 11/1973 Berner .................................. 357/76
4,499,485 2/1985 Schierz et al. ....................... 357/76

FOREIGN PATENT DOCUMENTS 5197726 8/1976 Japan .

Primary Examiner—Peter S. Wong
Assistant Examiner—Judson H. Jones
Attorney, Agent, or Firm—Armstrong, Nikaido, Marmelstein & Kubovcik

[57] ABSTRACT

A transformer with a rectifier is disclosed, wherein a transformer main body, having therein a primary coil and a secondary coil, is provided at its front surface with a secondary electrode plate connected to the secondary coil, and to secondary electrode plate is connected at its front surface to a terminal plate through a rectifier, and the two plates are fastened together by means of bolts, or the like, characterized in that the rectifier is formed of a semiconductor element comprising a semiconductor layer of silicon, or the like, having front and rear holding plates of molybdenum, or the like, the semiconductor element is held between metallic plated layers of gold, silver or the like previously formed on mutually facing inner surfaces of the two plates, and a frame seal member made of silicon rubber or the like surrounding the element is held between the two plates.

12 Claims, 6 Drawing Figures

TRANSFORMER WITH RECTIFIER

BACKGROUND OF THE INVENTION

This invention relates to a transformer with a rectifier used chiefly with a resistance welding machine.

As for a transformer of this kind, an example of a known type, as shown in FIG. 1, has a transformer main body, having therein a primary coil and a secondary coil, and is provided at its front surface with a secondary electrode plate a connected to the secondary coil, and the electrode plate a is provided at its front surface with a terminal plate c connected through a rectifier b, and the two plates a, c are fastened together by means of bolts d or the like. It is common with this type of transformer that the rectifier b is of the type that, as shown in the same Figure, a semiconductor element $b_1$ is encased in a casing e comprising front and rear electrode covers $e_1$, $e_1$ and a circumferential seal ring $e_2$ is held between the two covers $e_1$, $e_1$. The semiconductor element $b_1$ is also held in the casing e between the mutually facing surfaces of plates a, c. This conventional structure, however, is inconvenient in that the casing e causes the rectifier b to become comparatively large in thickness, and thereby the transformer apparatus is required to have a greater length as a whole. Additionally, it is inconvenient because when a sputtering operation is carried out, the peripheral portions of the two covers $e_1$, $e_1$ may be covered with sputtered material, likely resulting in a short-circuit between the two covers $e_1$, $e_1$ and accordingly between the two plates a, c.

SUMMARY OF THE INVENTION

This invention has for its object to provide a transformer free from the above deficiencies. In a transformer with a rectifier of the type where the transformer main body, having therein a primary coil and a secondary coil, is provided at its front surface with a secondary electrode plate connected to the secondary coil, and the secondary electrode plate is provided at its front surface with a terminal plate connected through a rectifier, the two plates being fastened together by means of bolts, or the like. The transformer is characterized in that the rectifier is formed of a semiconductor element comprising a semiconductor layer of silicon, or the like, having front and rear holding plates of molybdenum, or the like, and a circumferential seal ring of silicon rubber, or the like. The semiconductor element is held between metallic plated layers of gold, silver, or the like, previously formed on mutually facing inner surfaces of the two plates. A frame seal member made of silicon rubber or the like surrounding the element is held between the two plates.

BRIEF DESCRIPTION OF THE DRAWINGS

The above and other objects and the attendant advantages of the present invention will become readily apparent by reference to the following detailed description when considered in conjunction with the accompanying drawings wherein.

DETAILED DESCRIPTION OF THE DRAWINGS

Figure 1:
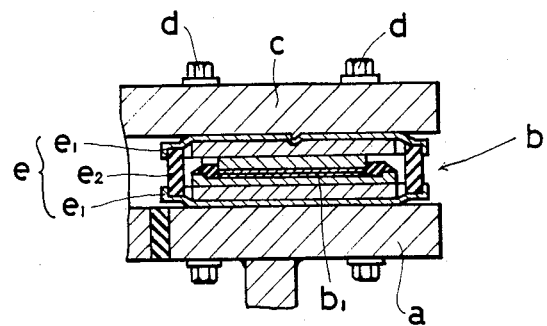
FIG. 1 is a sectional plan view of a conventional example.
Figure 2:
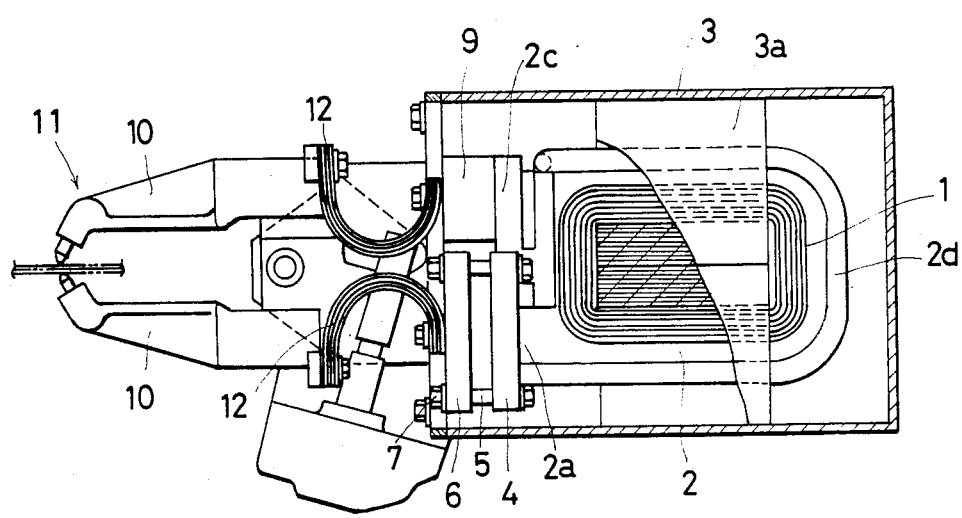
FIG. 2 is a side view, partly omitted, of one embodiment of the transformer of the instant invention.
Figure 3:
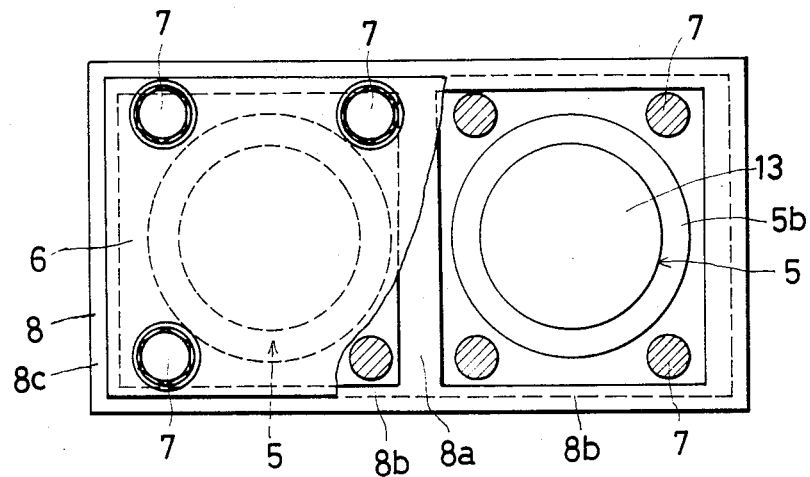
FIG. 3 is a front view, partly omitted, portion of the transformer of FIG. 2.

Referring to FIGS. 2-5 showing one embodiment of the transformer of the instant invention, numeral 1 denotes a primary coil, numeral 2 denotes a secondary coil, and numeral 3 denotes a transformer main body having therein the primary coil 1 and the secondary coil 2. The transformer main body 3 is provided at its front surface with a secondary electrode plate 4 connected to the secondary coil 2, and at its front surface, electrode plate 4 is connected to terminal plate 6 through a rectifier 5. The two plates 4, 6 are joined together by means of bolts 7. Numeral 3a denotes a core provided in the transformer main body 3 for mounting the two coils 1, 2 therein.

Figure 4:
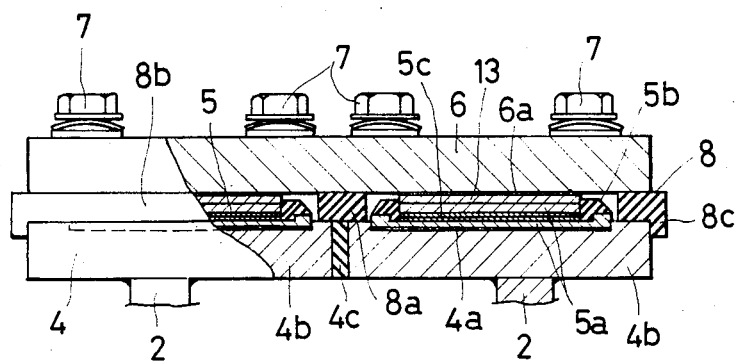
FIG. 4 is a plan view, partly in section, of the transformer of FIG. 2.

According to the transformer of the instant invention, as shown clearly in FIG. 4, the rectifier 5 is formed of a semiconductor element comprising a semiconductor layer 5c of silicon, or the like, having front and rear holding plates 5a, 5a made of molybdenum, or the like, and a circumferential seal ring 5b of silicon rubber, or the like. Rectifier 5 is held between metallic plated layers 4a, 6a of gold, silver, or the like, formed previously at mutually facing inner surfaces of the two plates 4, 6. Rectifier 5 is provided therearound with a frame seal ring 8 of silicon rubber, or the like, and held between the plates 4, 6.

Figure 5:
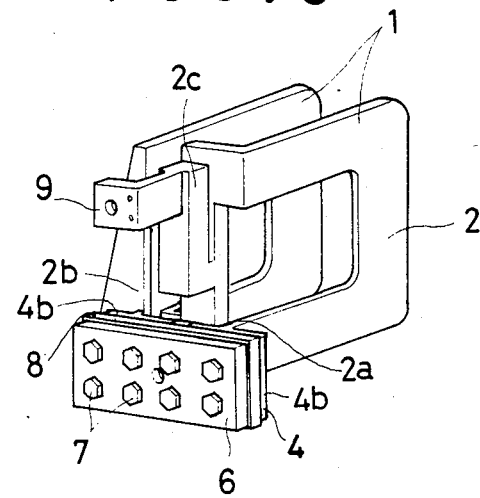
FIG. 5 is a perspective view of a secondary coil portion thereof.

As shown clearly in FIG. 5, the secondary coil 2 is formed of a belt-shaped conductor member of two turns, and the secondary electrode plate 4 is comprised of two half portions 4b, 4b which are so formed on one end 2a and the other end 2b of the secondary coil 2 so as to be integral therewith. These two half portions 4b, 4b are juxtaposed one with another, right and left, and have an intermediate insulation layer 4c interposed therebetween as shown in FIG. 4. Two half portions 4b, 4b are disposed in front of the transformer main body 3 so as to be in parallel with the turning axis of the secondary coil 2. Terminal plate 6 is formed of a single piece extending over the two half portions 4b, 4b. Rectifier 5 is also disposed on a front surface of each of the half portions 4b, 4b so as to be interposed between half portions 4b, 4b and the terminal plate 6. Additionally, an intermediate terminal plate 9 connected to an intermediate portion 2c of the secondary coil 2 is provided above the terminal plate 6 such that it is located in the same plane in which the terminal plate 6 is positioned.

In addition, resistance welding machine 11 has a pair of upper and lower gun arms 10, 10 provided in front of the transformer main body 3. Terminal plate 6 and the intermediate terminal plate 9 are electrically connected to the gun arms 10, 10 through respective feeding members 12, 12, each being composed of a large number of belt-shaped copper plates layered one upon another. Numeral 2d denotes a cooling water pipe attached to the outer surrounding surface of the secondary coil 2.

Figure 6:
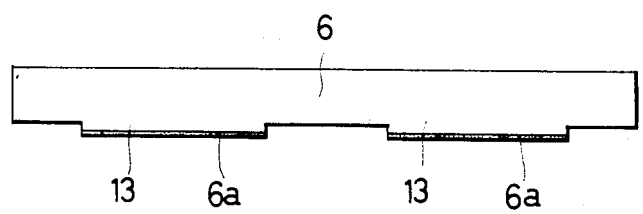
FIG. 6 is an explanatory diagram of a terminal plate portion in a further modified embodiment of the transformer of the instant invention.

The foregoing rectifier 5 may be interposed, as described, directly between the plated layers 4a and 6a on the mutually facing inner surfaces of the two plates 4, 6, but it is also possible, as illustrated clearly in FIG. 4, that a metal spacer 13 of copper, or the like, is prepared separately and interposed between rectifier 5 and terminal plate 6 or half portions 4b, 4b. It is also possible that, as shown in FIG. 6, the metal spacer 13 may be formed on the terminal plate 6 side so as to be integral therewith. In this example, plated layers 6a are formed on the spacer 13.

The foregoing frame seal member 8 is formed such that it extends along the outer peripheral edge portions of the two plates 4, 6 to form a generally rectangular frame. It is provided with middle frame portion 8a partitioning the right and left half portions 8b, 8b from one another.

This frame seal member 8 may be modified, as necessary as shown clearly in FIG. 4, such that the outer peripheral frame portion therof is provided with a flange 8c of comparatively large thickness formed integrally therewith for reducing the possibility of a short-circuit between the two plates 4, 6.

Thus, according to this invention, the rectifier interposed between the secondary electrode plate and the terminal plate in front thereof is formed of the semiconductor element having no casing encasing it and is held between the plated layers formed on the mutually facing surfaces of the two plates. This structure eliminates various deficiencies involved in the foregoing conventional example wherein the rectifier is provided with a casing encasing the same. In addition, a good electrical contact can be achieved by the structure of the two plates. Further, the frame seal member surrounding the periphery of the rectifier is held between the two plates so that the frame seal member can serve not only to shield the semiconductor element from the environment, but also to prevent a short-circuit between the two plates.

It is readily apparent that the above-described transformer with rectifier meets all of the objects mentioned above and also has the advantage of wide commercial utility. It should be understood that the specific form of the invention hereinabove described is intended to be representative only, as certain modifications within the scope of these teachings will be apparent to those skilled in the art.

Accordingly, reference should be made to the following claims in determining the full scope of the invention.

We claim:

1. A transformer and rectifier in combination, said combination comprising:
    a transformer main body;
    a primary coil mounted on said main body;
    a secondary coil mounted on said main body and being operatively connected with said primary coil;
    a secondary electrode plate having front and rear surfaces and being connected on its rear surface to said secondary coil and disposed at a front surface of said main body;
    a terminal plate;
    a rectifier providing a connection between said terminal plate and the front surface of said secondary electrode, said rectifier having semiconductor means for rectifying electrical current including,
        a semiconductor layer having front and rear holding plates, and
        a circumferential seal ring surrounding said holding plates;
    means for fastening said terminal plate and said secondary electrode plate together, said terminal plate and said secondary electrode plate having plated metallic layers facing each other and in contact with said semiconductor means held therebetween; and
    a frame seal member surrounding said semiconductor means and held between said terminal plate and said secondary electrode plate.

2. The combination of claim 1, wherein said secondary electrode plate comprises two half portions, each of which is connected to a separate end of said secondary coil, said two half portions being juxtaposed one with another in front of said transformer main body such that said half portions are in parallel with the turning axis of said secondary coil.

3. The combination of claim 2, wherein said terminal plate is formed of a single piece extending over said half portions.

4. The combination of claim 3, further comprising an intermediate terminal plate connected to an intermediate portion of the secondary coil, said intermediate terminal plate being disposed in the same plane in which said terminal plate is positioned.

5. The combination of claim 1, wherein said frame seal member is made of silicon rubber.

6. The combination of claim 1, wherein said frame seal member has a flange at its periphery thereof, said flange having a large thickness and extending outward around either one of said terminal or secondary electrode plates.

7. The combination of claim 1, wherein a metal spacer of copper is interposed between said rectifier and said terminal plate.

8. The combination of claim 7, wherein said metal spacer is integral with said terminal plate.

9. The combination of claim 1, wherein said fastening means comprises bolts.

10. The combination of claim 1, wherein said semiconductor layer is made of silicon.

11. The combination of claim 1, wherein said front and rear holding plates are comprised of molybdenum.

12. The combination of claim 1, wherein said circumferential seal ring is comprised of silicon rubber.

* * * * *

UNITED STATES PATENT AND TRADEMARK OFFICE
CERTIFICATE OF CORRECTION

PATENT NO. : B1 4,571,669
DATED : August 27, 1996
INVENTOR(S) : TSUJI et al.

It is certified that error appears in the above-indentified patent and that said Letters Patent is hereby corrected as shown below:

On the title page:
item [73], please change "Kogyok" to --Kogyo--; and
item [30], please change "58-140867" to --58-140867[U]--.

Signed and Sealed this

Twenty-seventh Day of May, 1997

Attest:

BRUCE LEHMAN

Attesting Officer

Commissioner of Patents and Trademarks

REEXAMINATION CERTIFICATE (2978th)

United States Patent [19]
Tsujii et al.

[11] B1 4,571,669
[45] Certificate Issued Aug. 27, 1996

[54] TRANSFORMER WITH RECTIFIER

[75] Inventors: Gen Tsujii; Takashi Yanagisawa, both of Saitama, Japan

[73] Assignee: Honda Giken Kogyok Kabushiki Kaisha, Tokyo, Japan

Reexamination Request:
No. 90/004,105, Dec. 29, 1995

Reexamination Certificate for:
Patent No.: 4,571,669
Issued: Feb. 18, 1986
Appl. No.: 590,383
Filed: Mar. 16, 1984

[30] Foreign Application Priority Data

Sep. 13, 1983 [JP] Japan ................... 58-140867

[51] Int. Cl.⁶ ............... H02M 7/06; H02M 1/00
[52] U.S. Cl. .................. 363/144; 219/137 PS; 219/116; 257/658; 257/727
[58] Field of Search ............ 363/144, 145; 219/130.1, 137 PS, 116; 257/658, 727

[56] References Cited

U.S. PATENT DOCUMENTS

| | | | |
|---|---|---|---|
| 3,412,294 | 11/1968 | Sciaky | 257/714 |
| 4,099,201 | 7/1978 | Mueller | 357/72 |
| 4,370,671 | 1/1983 | Eriksson | 357/79 |

FOREIGN PATENT DOCUMENTS

| | | |
|---|---|---|
| 1438420 | 1/1969 | Germany. |
| 1564613 | 10/1970 | Germany. |
| 2260217 | 6/1973 | Germany. |
| 3006023 | 9/1980 | Germany. |

*Primary Examiner*—Steven L. Stephan

[57] ABSTRACT

A transformer with a rectifier is disclosed, wherein a transformer main body, having therein a primary coil and a secondary coil, is provided at its front surface with a secondary electrode plate connected to the secondary coil, and to secondary electrode plate is connected at its front surface to a terminal plate through a rectifier, and the two plates are fastened together by means of bolts, or the like, characterized in that the rectifier is formed of a semiconductor element comprising a semiconductor layer of silicon, or the like, having front and rear holding plates of molybdenum, or the like, the semiconductor element is held between metallic plated layers of gold, silver or the like previously formed on mutually facing inner surfaces of the two plates, and a frame seal member made of silicon rubber or the like surrounding the element is held between the two plates.

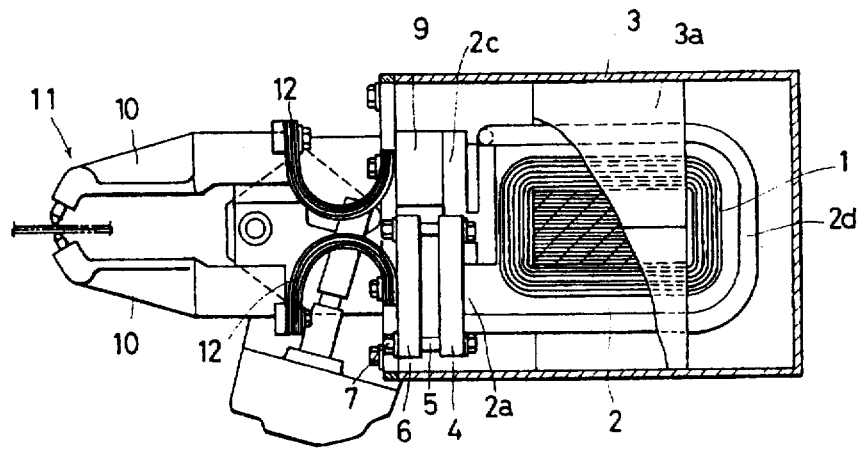

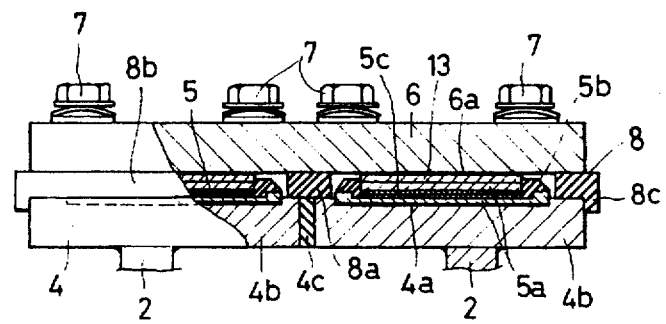

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 2 is cancelled.

Claims 1 and 3 are determined to be patentable as amended.

Claims 4–12, dependent on an amended claim, are determined to be patentable.

1. A transformer and rectifier in combination, said combination comprising:
   a transformer main body;
   a primary coil mounted on said main body;
   a secondary coil mounted on said main body and being operatively connected with said primary coil;
   a secondary electrode plate having front and rear surfaces and being connected on its rear surface to said secondary coil and disposed at a front surface of said main body;
   *wherein said secondary electrode plate comprises two half portions, each of which is connected to a separate end of said secondary coil, said two half portions being juxtaposed one with another in front of said transformer main body such that said half portions are in parallel with the turning axis of said secondary coil;*
   a terminal plate;
   a rectifier providing a connection between said terminal plate and the front surface of said secondary electrode, said rectifier having semiconductor means for rectifying electrical current including,
   a semiconductor layer having front and rear holding plates, and
   a circumferential seal ring surrounding said holding plates;
   means for fastening said terminal plate and said secondary electrode plate together, said terminal plate and said secondary electrode plate having plated metallic layers facing each other and in contact with said semiconductor means held therebetween; and
   a frame seal member surrounding said semiconductor means and held between said terminal plate and said secondary electrode plate.

3. The combination of claim [2] *1*, wherein said terminal plate is formed of a single piece extending over said half portions.

* * * * *